United States Patent [19]

Eichelberger et al.

[11] Patent Number: 4,470,883

[45] Date of Patent: * Sep. 11, 1984

[54] ADDITIVE PRINTED CIRCUIT PROCESS

[75] Inventors: Charles W. Eichelberger, Schenectady; Robert J. Wojnarowski, Ballston Lake, both of N.Y.

[73] Assignee: General Electric Company, Schenectady, N.Y.

[*] Notice: The portion of the term of this patent subsequent to Sep. 13, 2000 has been disclaimed.

[21] Appl. No.: 490,280

[22] Filed: May 2, 1983

[51] Int. Cl.$^3$ .............................................. H05K 3/12
[52] U.S. Cl. .................................. 204/15; 204/38 B; 204/129.35; 427/96; 427/98
[58] Field of Search ................. 427/98, 96; 204/38 B, 204/15, 129.35

[56] References Cited

U.S. PATENT DOCUMENTS

| | | | |
|---|---|---|---|
| 3,506,482 | 4/1970 | Hirohata | 427/98 |
| 3,576,662 | 4/1971 | Diebold | 427/302 |
| 3,764,280 | 10/1973 | Lupinski | 427/229 |
| 4,404,237 | 9/1983 | Eichelberger | 427/98 |

*Primary Examiner*—John D. Smith
*Attorney, Agent, or Firm*—Geoffrey H. Krauss; James C. Davis, Jr.; Marvin Snyder

[57] ABSTRACT

Electrical conductors having enhanced resolution/spacing and adhesion characteristics are prepared by applying a mixture of a carbonyl-processed nickel powder and a polymer to a substrate, curing the polymer, and immersing the cured polymer pattern in an augmentative-replacement/electroplating bath, to effect an augmentative replacement reaction to form a contiguous layer of conducting metal on the substrate and thereafter electroplating an additional metal layer on the contiguous layer.

26 Claims, No Drawings

ADDITIVE PRINTED CIRCUIT PROCESS

BACKGROUND OF THE INVENTION

The present application relates to printed conductive circuits formed by additive methods and, more particularly, to a novel additive printed circuit process yielding conductors having increased adhesion and resolution capability.

Many types of electronic apparatus are known in which the various electrical components are interconnected by conductors. The interconnecting conductors are fabricated by a wide variety of processes such as, for example, thick-film fired conductor systems, polymer conductors and printed circuit boards.

In thick-film fired conductors, a mixture of a conducting metal powder, a ceramic or glass binder and an appropriate vehicle is screen printed on a substrate. The conductor pattern on the substrate is then fired at a relatively high temperature, typically between 650° and 900° C. As the temperature rises to the firing temperature, the vehicle is volatilized, leaving the metal and binder behind. At the firing temperature, sintering of the metal takes place to a greater or lesser extent with the binder providing adhesion between the metal film formed and the substrate.

Thick-film fired conductors have classically employed precious metals such as gold, silver, platinum and palladium. Recently these noble metals have soared in cost, and new conductor systems using copper, nickel and aluminum are being made commercially available. The cost of the precious metal systems is prohibitive where a low cost conductor system is desired. The newer metal systems are not significantly cheaper because of the special chemistry which is required to prevent oxidation of the metal during the firing process. Moreover, these systems are very difficult to solder using the conventional tin/lead solder and the high firing temperatures required during fabrication preclude the use of low cost substrate materials. Some of the nickel systems can be fired on a soda-lime glass at temperatures just below the melting point of the glass but the resulting conductivity of the conductor is relatively low.

The term "polymer conductor" is actually a misnomer since the polymer is not actually a conductor. Instead, the polymer is heavily loaded with a conducting metal and screened onto a substrate. The advantage of this system is that the polymer can be cured either catalytically or thermally at temperatures which range from room temperature to about 125° C. As a result of this so-called "cold precessing", it is possible to use very inexpensive substrates such as films of Mylar ® (polyethylene terephthalate). The mechanism by which conductivity is achieved is supplied entirely by contact between individual metallic particles. It has been found that the only metals which can be loaded into the polymer and give acceptable conductivity are the precious metals such as gold and silver. All of the other standard conducting metals oxidize over a period of time, reducing the conductivity between the particles. Silver has been the predominant choice in polymer conductor systems but the silver systems are generally not solderable because the silver is leached by the lead-tin solder. When the price of silver is about $10–11 per ounce, these conductor systems are competitive with other systems if used on very low-cost substrates such as thin Mylar ® films. However, when the price of silver is higher, the systems are not competitive with printed circuit boards.

The techniques used to prepare printed circuit boards can be divided into additive, semi-additive and subtractive technlogies. In the semi-additive and subtractive techniques, the starting point is a substrate, which can vary widely from phenolics to glass-filled epoxies, on which a copper foil is bonded. In the traditional additive preparatory system, the copper foil is very thin, usually on the order of about 200 microinches. A resist is patterned such that the copper is exposed only where the conductors are desired and the board is then electroplated to form copper conductors of about 1 mil in thickness. The plating resist is stripped and the copper is etched. In areas where the conductor is not desired, the copper is only about 200 microinches thick so that etching quickly removes this copper while leaving a 1 mil thick conductor. In the subtractive process, the starting thickness of the copper foil is usually between 1 and 2 mils. An etch resist is deposited wherever the conductors are desired, the board is etched and the resist is then removed. The resist prevents etching where the conductors are desired leaving conductor runs.

Both the semi-additive and subtractive printed circuit board procedures require the application of a copper foil over the entire substrate, deposition and removal of a resist, etching of the printed circuit board, drilling holes for component insertion, and in one case, the additional step of electroplating.

In the traditional additive technique, conductors are formed by printing a sensitizer pattern in which the sensitizer contains palladium or a metal which is subsequently replaced by palladium after a sensitizing dip. The substrate is then placed in a catalytic-type plating bath to form an electroless copper or nickel layer in the same area as the sensitizer pattern. This reaction can be allowed to continue until a sufficient thickness of condutor is established. However, this reaction is generally so slow that only a thin layer of conductor is built up in this fashion and the conductor must be subsequently electroplated. The very thin layer of electroless copper initially formed by the catalytic reaction is not capable of sustaining normal plating currents until a substantial additional layer of copper has been built up. If too high a current is applied, a condition generally known as burning results.

The most significant drawback of the printed circuit board technology is that a substantial number of processing steps are necessary and this requires a large amount of associated equipment. In addition, the choice of substrate materials is limited to one of those available for circuit board materials. The number of processing steps and equipment results in relatively high processing costs and the limitation of the substrate material eliminates the opportunity to use a decorative or structural member which may be required in the apparatus as a substrate.

In U.S. patent application Ser. No. 220,342, filed Dec. 29, 1980, now U.S. Pat. No. 4,404,237, issued Sept. 13, 1983 and assigned to the assignee of the present invention, which is entirely incorporated herein by reference, the formation of an electrical conductor by an augmentative replacement reaction technique is described. The desired conductive design is applied to the substrate with an ink composition which contains a finely-divided metal powder, a curable polymer and a solvent. The curable polymer is at least partially cured and then the resulting ink composition pattern is contacted with a metal salt solution in which the metal cation is more noble than the metal of the finely-divided powder and the anion forms a salt with the metal of the salt and the powder which is soluble in the solution. This system is simple to effect; each processing step is relatively fast and the waste materials generated are generally environmentally safe and do not require special disposal processing. The system can be applied to a multiplicity of lowcost substrate materials such as soda-lime glass, plastic and even paper. The augmentative replacement process conductors can be electroplated, as disclosed and claimed in U.S. patent application Ser. No. 336,807, filed Jan. 4, 1982 now abandoned, and assigned to the assignee of the present invention, which application is entirely incorporated herein by reference. The electrical conductors are therein prepared by applying a mixture of metallic powder and a polymer on a substrate, with subsequent curing of the polymer before effecting an augmentative replacment reaction to replace some of the metallic powder with a more noble metal to form a contiguous layer of conducting metal on the substrate and thereafter electroplating an additional metal layer on the contiguous layer.

While the foregoing provides a very low cost process for providing a conductor pattern upon a substrate surface, certain uses require relatively high resolution of the printed conductor lines and the spaces therebetween, typically to 10 milli-inch line widths and spacings. Increased adhesion between the plated conductor layer and the underlying ink, and between the ink and the substrate, while retaining the good thermal and humidity characteristics of the basic ink composition, are also desired. Accordingly, an additive printed circuit process having all of the features set forth in the above-enumerated pair of applications, plus the additional resolution and adhesion properties mentioned, is highly desirable.

BRIEF SUMMARY OF THE INVENTION

In accordance with the invention, a printed circuit conductor pattern is provided in a desired design by: applying that design to the surface of a substrate with an ink composition which contains a finely-divided powder of a carbonyl-processed nickel metal and a polymer ink. The resulting ink composition pattern is cured and is pre-cleaned prior to immersion in a plating bath for fabrication of a contiguous conductive layer on the surface of the ink design. After plating is completed, a post-baking step is utilized to further increase adhesion.

In presently preferred embodiments, the polymer ink may be an epoxy or an imide ink. The conductive layer is formed of copper.

Accordingly, it is an object of the present invention to provide a novel method for providing additive printed circuit conductor patterns for improved resolution and adhesion, on a substrate surface.

This and other objects of the present invention will become apparent upon consideration of the following detailed description.

DESCRIPTION OF THE INVENTION

The process of the present invention, in its broadest form, involves the establishment of the desired conductive pattern on a substrate by means of a metal-containing cured polymer which is subjected to an augmentation replacement reaction followed by an electroplating step. The process is particularly adapted for the use of screen-printing techniques to establish the conductor patterns on the substrates, although the invention is not so limited. Other types of printing and application techniques can be used including, without limitation, pad flexographic printing, stencil, rotogravure and offset printing.

The substrates on which the conductive patterns are formed are not restricted and any insulator to which the metal ink can be adhered is employable. Thus, the usual printed circuit substrates can be used as well as glass-filled polyesters, phenolic boards, polystyrene and the like. Of particular interest as substrates for use in the present invention are glass and steel, which is covered with an insulator such as porcelain or epoxy. The latter materials are often used as structural or decorative elements in many constructions and applying electronic elements directly to them provides advantages with respect to ease of fabrication, essential structural members and cost.

The ink composition used in the present invention is a combination of a finely-divided nickel powder with a polymer whose viscosity and flow characteristics can be controlled by the incorporation of a solvent therein. The metal powder generally has a particle size of less than about 50 microns, preferably 3 to about 25 microns and most preferably about 3–7 microns, by Fisher Sub-Sieve Sizer. When the ink is deposited by screen printing, the metal particles must be of a size to pass through the screen, i.e., if a 325 mesh screen is being used, the metal particles should be $-325$ mesh.

The polymer employed in the ink is any material (curable or otherwise) or mixture thereof which exhibits a degree of adhesion to the substrate being employed and to the finely-divided metal powder which is dispersed therein. Typical polymers which can be employed include the homopolymers and copolymers of ethylenically unsaturated aliphatic, alicyclic and aromatic hydrocarbons such as polyethylene, polypropylene, polybutene, ethylene propylene copolymers, copolymers of ethylene or propylene with other olefins, polybutadiene, polyisoprene, polystyrene and polymers of pentene, hexene, heptene, bicyclo-(2,2,1)2-heptane, methyl styrene and the like. Other polymers which can be used include polyindene, polymers of acrylate esters and polymers of methacrylate esters, acrylate and methacrylate resins such as ethyl acrylate, n-butyl methacrylate, isobutyl methacrylate, ethyl methacrylate and methyl methacrylate; alkyd resins; cellulose derivatives such as cellulose acetate, cellulose acetate butyrate, cellulose nitrate, ethyl cellulose, hydroxyethyl cellulose, methyl cellulose, and sodium carboxymethyl cellulose; epoxy resins; hydrocarbon resins from petroleum; isobutylene resins; isocyanate resins (polyurethanes); melamine resins such as melamine-formaldehyde and melamineura-formaldehyde; oleo-resins; polyamide polymers such as polyamides and polyamide-epoxy polyesters; polyester resins such as the unsaturated polyesters of dibasic acids and dihydroxy compounds; polyester elastomer and resorcinol resins such as resorcinol-phenol-formaldehyde, resorcinol-furfural, resorcinol-phenol-formaldehyde and resorcinol-urea; rubbers such as natural rubber, reclaimed rubber, chlorinated rubber, butadiene styrene rubber, and butyl rubber, neopreme rubber, polysulfide, vinyl acetate and vinyl alcohol-acetate copolymers, polyvinyl alcohol, polyvinyl chloride, polyvinyl pyrollidone and polyvinylidene chloride, polycarbonates, graft copolymers of polymers of unsaturated hydrocarbons and of unsaturated monomers such as graft copolymers of polybutadiene, styrene and acrylonitrile, commonly called ABS resins, polymides and the like.

The polymers and inks of the present invention can contain various other materials such as fillers, e.g. glass fiber, glass powder, glass beads, asbestos, mineral fillers, wood flour and other vegetable fillers, dyes, pigments, waxes, stabilizers, lubricants, curing catalysts such as peroxides, photosensitizers and amines, polymerization inhibitors and the like. It is preferred, but not essential, to employ a polymer which exhibits a substantial degree of volumetric shrinkage upon curing.

The amounts of the finely-divided nickel powder and polymer are adjusted such that the nickel constitutes at least about 80% by weight of the mixture after curing. Preferably, the metal is about 85% by weight. It is desired to have a significant amount of the nickel particles forming part of the surface of the cured ink to facilitate the subsequent augmentation replacement reaction.

A solvent is used in the ink formulation in order to adjust the viscosity and flow characteristics for the type of printing desired. In general, the solvent should be employed in an amount sufficient that the ink has a viscosity of 20,000–200,000 cps at room temperature and preferably about 50,000–150,000 cps. Suitable solvents or diluents can be aliphatic or aromatic and usually contain up to about 30 carbon atoms. They include the hydrocarbons, ethers and thioethers, carboxyl compounds such as esters and ketones, nitrogen containing compounds such as amides, amines, nitriles and nitro compounds, alcohols, phenols, mercaptans and halogen containing compounds. Examples include alcohols such a methanol, ethanol, propanol, benzyl alcohol, cyclohexanol, ethylene glycol, glycerol and the like, aromatic materials such as benzene, toluene, xylene, ethyl benzene, napthalene, tetralin and the like, ethers such as methyl ether, ethyl ether, propyl ether, methyl t-butyl ether, and the like, alkanes such as methane, ethane, propane and the like, dimethyl sulfoxide, butyl formate, methyl acetate, ethyl acetate, formamide, dimethyl formamide, acetamide, acetone, nitrobenzene, monochlorobenzene, acetophenone, tetrahydrofuran, chloroform, carbon tetrachloride, trichloroethylene, ethylbromide, phenol, mercaptophenol, and the like. Additionally, reactive solvents or diluents such as triallyl isocyanurate can be used if desired. It is preferred to employ a solvent which is relatively non-volatile at room temperature so that the viscosity and flow of the ink is appropriate during application to the substrate and highly volatile at the curing temperature of the polymer or other temperatures above the application temperature. The carbitol series of solvents and particularly butyl carbitol (diethylene glycol monobutyl ether) has been found to be particularly appropriate.

The preferred nickel powder is formed by a carbonyl process which results in a powder having a surface substantially free of oxide and a spherical, but nodular, shape. Utilizing the carbonyl-processed nickel powder, such as type NI123 nickel powder available from International Nickel Company, requires far less loading than the loading required with substantially spherical particles of nickel processed by other methods. That is, the packing efficiency of the carbonyl-processed nickel powder is high enough for good loading and also low enough for the polymer ink to adhere to the particles and to the substrate surface when cured. Thus, the packing efficiency of the carbonyl-processed nickel powder is far less than the packing efficiency of spherical particles, which can be placed very close to one another and have very little empty volume between the particles thereof. It is necessary to have sufficient loading of metal powder, typically at least about 80%, by weight, of the ink, in our novel process, so that there is an exposed powder surface when the conductor patterned ink is cured, to which the electroplated layer can be adhered. If spherical particles are used, a much higher loading ratio is required before an exposed surface is obtained. The higher loading ratio of spherical particles thus leads to poor printing characteristics and also poor adhesion of the patterned ink to the substrate, due to less polymer volume being available for adhesion. In the present method, a polymer:metal powder volume ratio of about 1:1 is used and provides sufficient polymer for excellent adhesion of the conductor patterned ink to the substrate, while the nodular formations of the powdered metal provide excellent mechanical keying of the particles within the ink itself and provide cohesive adhesion within the ink. For these reasons, metal powders having particles with flaked or elongated-rod shapes are not preferred, as the packing efficiency is very poor and the loading of metal powder in the ink is reduced while flow characteristics are adversely affected.

If an epoxy ink is utilized, a fugitive diluent—such as butyl glycidal ether (BGE), which is compatible with the particular epoxy (e.g. DEN438 Novolac epoxy, from Dow Chemical Company)—is used to lower the viscosity of the epoxy vehicle. The fugitive diluent should possess a relatively low vapor pressure, allowing some of the diluent to evaporate during the curing process. The use of a glycidal either, having an epoxy group which reacts with the epoxy, causes any of the BGE, which does not evaporate during the curing process, to be reacted into the epoxy matrix. Thus, there is no solvent to be trapped in the epoxy and cause deterioration of the epoxy properties and affect adhesion of the epoxy to the substrate.

If an epoxy ink is used, the epoxy and the fugitive diluent may be premixed. A quantity of the premixed epoxy/diluent mixture is combined with a flow control agent, a wetting agent and the desired quantity of the carbonyl-processed nickel powder. The ink composition thus formed may be temporatily stored. At the time of use, a quantity of a curing agent is added. The resulting ink is applied to the surface of the substrate to achieve the desired conductor patterns thereon. For example, standard printed circuit application technology can be employed. Any temperature which will not cause premature curing of the ink, and at which temperature the viscosity and flow characteristics of the ink are appropriate to the application technique used, can be employed. It is preferred, but not necessary, to permit at least a portion of the diluent to evaporate after application of the ink to the substrate and before curing.

The ink-patterned substrate may be moved directly from the patterning step into the curing, or polymerizing, step. Curing or polymerization can be carried out by the most convenient method. If an autocatalyst has been added, the polymer will cure by itself with no additional initiation. If an ultraviolet light initiator has been utilized, the conductor-patterned substrate can be passed under a high-intensity ultraviolet source to cause the initiator to begin the curing reaction. It is presently preferred to employ a thermocuring system which is activated by exposure to temperatures from about 180° C. to about 330° C. for a time between 5 and 60 minutes.

The exact temperature/time curing regime will be dependent upon the polymer ink utilized and, to some extent, upon the substrate used. As a result of the curing step, a closely-compacted metal powder bound to the substrate by the cured polymer is achieved. Because of the high percentage of metal and the shrinkage of the polymer chosen, the conductive pattern thus obtained has a relatively high conductivity, due primarily to physical contacts between the carbonyl-processed nickel particles. In a preferred embodiment of this invention, that conductivity is on the order of 0.2–1.0 ohms per square for a 1.5 milli-inch thick deposit of ink printed through a 200 mesh stainless-steel screen. This is the lowest resistivity of any non-noble polymer ink known to us.

After curing, the ink pattern is preferably cleaned in an acid solution; stainless steel electrodes are utilized in the pre-cleaning bath with a current set to evolve hydrogen at the surface of the conductor patterned ink. A typical current density, during the pre-cleaning step, is on the order of 0.2 amperes per square inch, maintained for a period between about 1 and about 2 minutes. Relatively violent air or fluid motion agitition is utilized throughout the pre-clean and subsequent plating steps. The evolved hydrogen serves to reduce the oxide on the surface of the nickel powder and tends to scrub away any thin coating of polymer resin on the conductor patterned surface; the patterned surface is thus activated to accept electroplating. The pre-cleaning solution is quickly drained from the pre-cleaned patterned substrate and that substrate is immediately transferred to the electroplating bath. Advantageously, both the pre-cleaning bath and the plating bath contain essentially the same amount of acid and water so that no rinse cycle is necessary between the pre-cleaning and plating steps; the substrate surface therefore never need be brought into direct contact with air, as a layer of pre-cleaning bath solution always covers the patterned ink.

The patterned, cleaned substrate is now subjected to an augmentative-replacement/electroplating process to form a contiguous layer of a second metal, e.g. copper, on the surface of the patterned ink and in the ink adjacent to the surface. In this step, the patterned ink is contacted by a metal salt solution having a metal, e.g. copper, cation which is more noble than the finely-divided nickel and in which the anion of the metal salt forms soluble salts with both the cation and the nickel. For a copper augmentative-replacement/plating bath, copper electrodes are used at a current density of 1 ampere per square inch or greater. A milli-inch of copper can be built up on the ink surface in less than 5 minutes. Advantageously, the number of squares between the plating current source electrical contact and the end of the conductor run is held to a maximum value on the order of 100 squares or less. This limitation serves to reduce the length of time required for plating to traverse the complete conductor run. The somewhat arbitrary value of 100 squares is determined by the relationship between the effective resistivity of the plating bath and the resistance per square of the pattern conductor ink. This relationship is given by the equation:

$$I = (V/Rb)\exp((-R1/Rb)N)$$

where I is the current per unit area, V is the voltage applied to plating bath, N is the number of squares, R1 is the resistivity of the pattern conductor ink and Rb is the resistance per square inch of the plating bath. For example, the application of 4 volts to attain a current density of 1 ampere per square inch results if a bath resistance of 4 ohms per square inch is used. A typical resistivity for the pattern conductor ink is about 0.4 ohms per square, whereby it can be seen that a current of 30% of the full scale value will occur at a distance of 10 squares from the connection to the plating current source. As current flows, copper is plated along the conductor and copper plating appears to "walk out" along the conductor run. It will also be seen that the conductor runs which are orders of magnitude longer than the length which gives an exponential ratio, i.e. R1/Rb, of 1 will take a substantial length of time for completion of electroplating. Experimental data indicates that 10 times this conductor length can be adequately plated within a few minutes utilizing the full applied voltage. This indicates that the nearest order of magnitude of approximately 100 squares is preferred.

After plating, a post-bake step is preferredly utilized to further increase the ink-substrate adhesion. This post-bake step is typically carried out at a preferred temperature of about 210° C., in the range of 180°–240° C., for a preferred period of about 1 minute, in the range from about 15 seconds to 3 minutes.

In order to further illustrate the present invention, various nonlimiting examples are set forth below. Throughout the specification and claims, all parts and percentages are by weight and all temperatures are in degrees Celsius unless otherwise indicated.

EXAMPLE 1

A conductor patterned ink was prepared by premixing 65 grams of DEN438 Novolac epoxy (Dow Chemical Co.) with 85 grams of butyl-glycidal-ether (BGE) and 1.2 grams of γglycidoxy propyl tri methoxy silane. 40 grams of the above starting epoxy mixture was then mixed with about ⅜ gram of a flow control agent (such as the BE-173 agent available from Nazdar Corp.) and about ⅓ gram of a wetting agent (such as agent RA-600 available from GAF Co.) and 148.6 grams of the carbonyl-processed nickel powder NI123 (International Nickel Co.). Prior to the ink being printed, 5.2 grams of a curing agent (curing agent Z, Shell Chemical Co.) was mixed with the powder-ink composition. The ink was printed on a XPC paper phenolic substrate through a 200 mesh stainless steel screen to provide a pattern of 10 milli-inch wide conductors, with 10 milli-inch spacings, on the substrate surface. The patterned substrate was cured at a temperature of about 210° C. for 40 minutes.

The resulting patterned substrates were measured to have resistivities on the order of 0.2–1.0 ohms per square, at a thickness of 1.5 milli-inches, with an ink composition having about 84.6%, by weight, of the carbonyl-processed nickel after curing.

The resulting cured patterned substrates were then pre-cleaned in a pre-cleaning solution of 5 gallons of water to 1000 grams of sulphuric acid 98%, for a period of between 1 and 2 minutes with a current density of about 0.2 amperes per square inch, while relatively violent fluid motion agitation was utilized to scrub the surface with the hydrogen evolved thereat. The pre-cleaned patterned substrates were then immediately drained and immersed in a copper electroplating bath formed of 5 gallons of water in which were dissolved: 1,000 grams of sulphuric acid 98%, 1.94 grams of hydrochloric acid 37%, 4,832 grams of copper sulphate pentahydrate and 80 milliliters of a copper brightner (Cu Back #1 Brightner, Copper Technology Corp.). While using a copper anode and the ink as a cathode, with 4 volts applied therebetween and a current density of about 2 amps per square inch, about 1 milli-inch of copper was built up on the conductor ink in about 5 minutes. The resulting final conductivity was measured to be not greater than 1 milli-ohm per square.

A peel adhesion test was conducted by subjecting the conductor to a force, substantially perpendicular to the substrate surface plane; a peel force of about 2.5 pounds per linear inch was measured.

EXAMPLE 2

The plated conductor pattern ink was then subjected to a post-baking step at 210° C. for 1 minute and the peel test repeated. A peel force of 5.5 pounds per linear inch (over twice that realized without the post-baking step) was realized.

EXAMPLE 3

A cured polymer conductive pattern on an XPC paper phenolic substrate was prepared as described in Example 1, but without the pre-cleaning step prior to the plating step. The final conductivity was measured to be not greater than 1 milli-ohm per square, but the peel force was found to be approximately 1 pound per linear inch.

EXAMPLE 4

The patterned substrate of Example 3 was subjected to the post-baking step of Example 2 and the peel force increased to 2.3 pounds per linear inch, which is still less than the peel force realized for the non-post-baked, but precleaned conductor-substrate of Example 1.

EXAMPLE 5

Example 1 was repeated using an epoxy-coated aluminum substrate; the curing step was carried out at a temperature of 290° C. for about 12 minutes. Similar results were obtained for the epoxy-coated aluminum substrate as were obtained for the XPC paper phenolic substrate.

EXAMPLE 6

An ink composition was prepared by combining 80 grams of an ester imide (79EI164 ester imide wire enamel, General Electric Co.) with 0.6 grams of the BE-173 flow control agent and 0.6 grams of the RA-600 wetting agent. Then 235.3 grams of the carbonyl-processed NI123 nickel powder was thoroughly mixed into the ester-imide mixture. The resulting ink was printed on an epoxy-coated steel substrate through the 200 mesh stainless steel screen to provide a conductor pattern on the substrate surface. The ink composition pattern was cured for 20 minutes at 290° C. The resulting cured ink composition had about 86%, by weight, of the carbonyl-process nickel powder. The resistivity of the 1.5 milli-inch thick cured pattern was again measured to be in the range of 0.2–1.0 ohms per square. The sequences of pre-cleaning, plating and post-baking steps of Examples 1–4 were carried out as therein described, with substantially similar results being obtained in each trial.

Thus, it will be seen that relatively low resistivity conductors, capable of being printed to line widths as narrow as 10 milli-inches with line-to-line separations on the order of 10 milli-inches, can be provided by the use of a carbonyl-processed nickel powder in a polymer ink, with subsequent augmentative-replacement/electroplating of a conductive copper layer thereon. The use of a pre-cleaning bath, prior to augmentative-replacement/electroplating, and/or a post-baking step, after augmentative-replacement/electroplating, adds substantial adhesion and increases resistance to peeling forces.

Many modifications and variations to our novel additive printed circuit process will now occur to those skilled in the art. It is our intent, therefore, to be limited only by the scope of the appending claims and not by the specific details or instrumentalities of the illustrative examples set forth herein.

What we claim is:

1. A method for forming an electrical conductor in desired areas of a substrate, comprising the steps of:
   preparing an ink composition having finely-divided nickel powder in a polymer ink;
   adjusting the amount of finely-divided nickel powder to comprise at least 80%, by weight, of the ink composition when that composition is cured;
   applying the ink composition in a desired design to a surface of a substrate;
   curing the ink composition; and
   contacting the cured ink composition design with a metal salt solution in which the metal cation is more noble than the finely-divided nickel and the anion of the metal salt forms soluble salts with the cation and the finely-divided nickel, to form a contiguous layer of the metal on the ink composition design by a combination augmentative-replacement and electroplating reaction.

2. The method of claim 1, wherein said finely-divided nickel comprises nickel particles having a substantially sperical, but nodular, shape.

3. The method of claim 2, wherein said nickel particles are carbonyl-processed nickel particles.

4. The method of claim 1, further comprising the step of pre-cleaning the cured ink composition prior to the contacting step.

5. The method of claim 4, wherein the precleaning step includes the steps of submerging the cured ink composition in an acid-solution bath to cause hydrogen to be evolved at the ink composition surface.

6. The method of claim 5, further including the step of maintaining a layer of the acid-solution upon the ink composition surface while moving the cleaned ink composition to the contacting step.

7. The method of claim 4, further comprising the step of post-baking the composition-bearing substrate after completion of the contacting step.

8. The method of claim 7, wherein the post-baking step is carried out at a temperature in the range of about 180° C. to about 240° C.

9. The method of claim 8, wherein the post-baking step is carried out at a temperature of about 210° C.

10. The method of claim 8, wherein the post-baking step is carried out for a time of about 15 seconds to about 3 minutes.

11. The method of claim 10, wherein the post-baking step is carried out for about 1 minutes.

12. The method of claim 1, further comprising the step of post-baking the composition-bearing substrate after completion of the contacting step.

13. The method of claim 12, wherein the post-baking step is carried out at a temperature in the range of about 180° C. to about 240° C.

14. The method of claim 13, wherein the post-baking step is carried out at a temperature of about 210° C.

15. The method of claim 13, wherein the post-baking step is carried out for a time of about 15 seconds to about 3 minutes.

16. The method of claim 15, wherein the post-baking step is carried out for about 1 minute.

17. The method of claim 1, wherein said polymer ink is a thermal curing polymer ink and said curing step includes the step of maintaining the ink composition-bearing substrate at a temperature from about 180° C. to about 330° C. for a time between about 5 minutes and about 60 minutes.

18. The method of claim 17, wherein said polymer ink is an epoxy ink, and said curing step is carried out at a temperature of about 210° C. for about 40 minutes.

19. The method of claim 17, wherein said polymer ink is an epoxy ink, and said curing step is carried out at a temperature of about 290° C. for about 12 minutes.

20. The method of claim 17, wherein said polymer ink is an ester imide ink, and said curing step is carried out at a temperature of about 290° C. for about 20 minutes.

21. The method of claim 1, wherein said nickel particles have a size of less than about 50 microns.

22. The method of claim 21, wherein the finely-divided nickel particles have a size of about 3–25 microns.

23. The method of claim 22, wherein the finely-divided nickel particles have a size of about 3–7 microns.

24. The method of claim 1, wherein said polymer ink is an epoxy ink.

25. The method of claim 1, wherein said polymer ink is an ester imide ink.

26. The method of claim 1, wherein said metal is copper.

* * * * *